Nov. 10, 1970 V. FONG ET AL 3,539,875

HARDWARE ENVELOPE WITH SEMICONDUCTOR MOUNTING ARRANGEMENTS

Filed Sept. 25, 1968 2 Sheets-Sheet 1

INVENTORS
VICTOR FONG
BY BRADFORD K. HARRINGTON

Frank R. Trifari
AGENT

INVENTORS
VICTOR FONG
BRADFORD K. HARRINGTON
BY
Frank R. Trifari
AGENT

United States Patent Office 3,539,875

Patented Nov. 10, 1970

3,539,875

HARDWARE ENVELOPE WITH SEMICONDUCTOR MOUNTING ARRANGEMENTS

Victor Fong, Cumberland, and Bradford K. Harrington, Coventry, R.I., assignors, by mesne assignments, to U.S. Philips Corporation, New York, N.Y., a corporation of Delaware Filed Sept. 25, 1968, Ser. No. 762,562
Int. Cl. H01l 1/22, 1/10, 1/12
U.S. Cl. 317—100 8 Claims

ABSTRACT OF THE DISCLOSURE

A semiconductor assembly housing is constructed by mounting a semiconductor chip or wafer structure on a ceramic base member which has been provided with a plurality of electrically isolated metalized segments, upon one of which the semiconductor structure is mounted, a number of individual leads connecting the remaining electrodes on the semiconductor structure to other segments of the metalized areas. Connection to the metalized area is made by external electrodes which are directly mounted to the respective metalized area on the ceramic base. The ceramic base is then encapsulated in a plastic encapsulant and a central aperture, passing through the encapsulant and the ceramic base, is utilized for mechanically fastening the assembly to a chassis or mounting plate or surface under portion of the ceramic base making direct contact with the mounting surface.

The present invention relates to semiconductor encapsulation and more particularly to an encapsulated mounting assembly for a semiconductor device.

The mounting of semiconductor structures presents conflicting considerations in terms of economy, reliability, size, heat dissipating ability and ease of mechanical fastening. For the higher current and higher power semiconductor devices, commonly known as housings and assemblies units have been found restrictive in terms of ease of mechanical fastening and heat dissipating ability. Furthermore, the design of known mounting assemblies are generally complex, connection to the interior semiconductor structure difficult, and large area requirements for attachments of cooling devices and for the interconnection of the semiconductor enclosure to a base or chassis for suitable heat dissipation are cumbersome. Other design difficulties are presented when the mechanical fastener used to secure the assembly is constructed as an integral portion of the assembly and is used as part of the heat dissipation path.

It is therefore a primary object of the present invention to provide a novel and unique housing assembly for a semiconductor structure.

It is a further object of the invention to provide a novel and unique housing assembly for a semiconductor structure which will function as a mounting unit in a manner more efficient than heretofore achievable.

It is a still further object of the invention to provide a novel and unique housing assembly for a semiconductor structure which will act as an improved dissipator of heat generated by the semiconductor device encapsulated therein.

It is another object of the invention to provide a mounting and housing assembly for a semiconductor structure wherein the mechanical fastening device is not an integral part of the assembly, and is not relied upon as part of the heat dissipation path of the semiconductor device.

It is another object of the invention to provide a unique and novel semiconductor encapsulation and housing mount which is relatively simple in design and inexpensive in construction.

The foregoing objects are realized by a construction wherein a heat conducting electrically insulating base member such as a ceramic is provided with a central aperture. A semiconductor chip or wafer is mounted on the upper surface of the base member which has been metalized in a pattern allowing the connection of external electrodes to be made in any active area on the semiconductor chip. One of the active areas of the semiconductor, for example the collector region, forms the bottom of the chip and is secured directly to one of the metalized areas. The remaining semiconductor electrodes are directly connected to other metalized areas, as for example, by means of separate leads. The external electrodes are mounted directly to the metalized areas and may constitute as many as are needed, including redundant electrodes. The external electrodes may be any length desired and any shape or configuration convenient.

A suitable plastic encapsulation seals in the base member and may completely suround the member, allowing only the external leads to protrude through the sides of the encapsulant. The underportion or lower surface of the base member is allowed to protrude through the bottom of the plastic encapsulant. The central aperture in the base member is substantially aligned with a further aperture provided through the plastic encapsulant. A suitable mechanical fastening device is then passed through the base member and the encapsulant and secures the assembly directly to a suitable mounting base. The portion of the base member protruding through the plastic encapsulant makes a solid and direct contact with the mounting area, and permits maximum heat transfer and secure mechanical contact with the base member.

The foregoing description and objects, as well as further objects and features, will be more clearly understood from a consideration of the following detailed description taken in connection with the acompanying drawings wherein.

Figure 1:
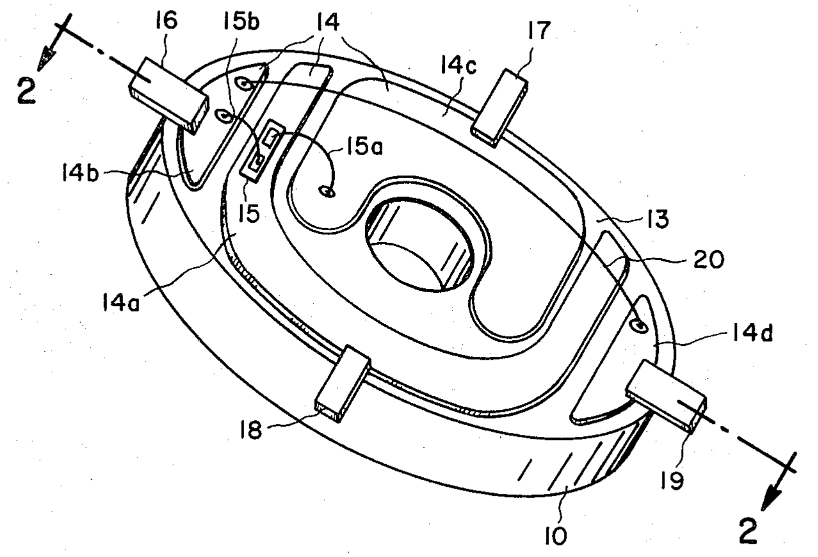
FIG. 1 illustrates a ceramic washer surface with metalized areas, semiconductor chip and external electrodes mounting, in orthogonal view.

Referring now to the drawings, wherein reference numbers have been applied uniformly to a part as it appears in several figures, and referring particularly to FIG. 1, a suitable heat conducting electrically insulating material such as a ceramic in the form of a base member 10 is, in accordance with the present invention, provided with a central aperture 11. The ceramic base member 10, illustrated in the form of round washer, may actually take any geometric form convenient, as for example, square or hexagonal. Further, the ceramic base member 10 may be composed of any good heat conducting material possessing good electrically insulating properties such as beryllia or alumina. The upper surface 13 of the base member 10 is provided with a plurality of individual metalized areas 14. Fabrication of these metalized areas on the surface 13 of the ceramic 10 may be by any convenient and suitable known method of metalization such as the application of a molybdenum-magnanese paste, applied through a silk screen containing the negative of the desired pattern, and fired at elevated temperatures, thereby forming a metalized surface. Further descriptions of another metalized process suitable for use with the present invention will be found in U.S. Pat. No. 3,371,046 assigned to the assignee of the present invention. Generally the surface of the metalized areas is gold-plated to facilitate soldering or brazing thereto.

A wafer or chip of semiconductor material containing therein a desired transistor structural configuration is mounted directly to the metalized area indicated as 14*a*. For purposes of illustration the semiconductor wafer or chip 15 is constructed with a collector region forming the bottom of the chip so that the metalized area 14*a* affords a direct connection to the collector region of the chip 15. As is common with semiconductor devices of the illustrated type, an emitter and base region which may be provided by standard diffusion techniques in the construction of the semiconductor chip 15, are connected by means of leads 15*a* and 15*b* joined to the metalized areas 14*b* and 14*c* respectively. Connection of the leads to the transistor electrodes and the metalized areas may be by standard thermocompression or ultrasonic bonding techniques. The semiconductor chip 15 may be attached to the metalized area 14*a* by a suitable brazing, eutectic soldering or alloying technique.

External electrodes 16, 17, 18 and 19 are secured to the individual metalized areas by means of any suitable technique such as soldering or brazing, the latter using, for example, a silver braze. The leads themselves may be constructed of oxygen free copper, grade A nickel or any other suitable electrically conducting material.

In the example shown, an additional metalized area 14*d* has been placed on the ceramic base member 10. As illustrated in FIG. 1, with a single semiconductor chip 15, the area 14*d* performs a redundant function. Connection is made to the metalized area 14*d* and then to the appropriate electrode on the semiconductor chip 15 by means of an additional lead 20 secured to areas 14*b* and 14*d* respectively. The lead can alternatively be formed as a direct connection between the electrodes 16 and 19. Although in the embodiment shown in FIG. 1 a single semiconductor chip 15 having three electrodes has been illustrated, it is understood that a single chip containing an integrated circuit possessing two or more electrodes or two or more chips or semiconductor devices may be secured to the metalized area 14*a* on the ceramic base member 10. In fact, with the vastly improved heat dissipating ability of the novel structure of the present invention, it becomes not only desirable but indeed feasible to attach several semiconductor chips along the metalized area 14*a* with suitable electrode connections to the remaining metalized areas 14*b*, *c* and *d*, respectively, the chips being arranged along the area of 14*a* surrounding the central aperture 11. Such an alternative arrangement is illustrated in the orthogonal view of FIGS. 2 and 3, to be explained in further detail below which illustrate the use of a second semiconductor device designated 21 and attached to metallized areas 14*b* by leads 21*b* and 21*a*, respectively. As illustrated, the devices are connected so as to act in parallel, thereby providing even high power handling capabilities. Commonly known balasting techniques for interconnecting several semiconductor devices in parallel may be used. For example, Nichrome or titanium resistance leads to counteract disproportionate current handling capacities inherent in the manufacture of individual semiconductor chips can be employed. It is understood that electrical connections other than the parallel variety can also be employed.

Figure 2:
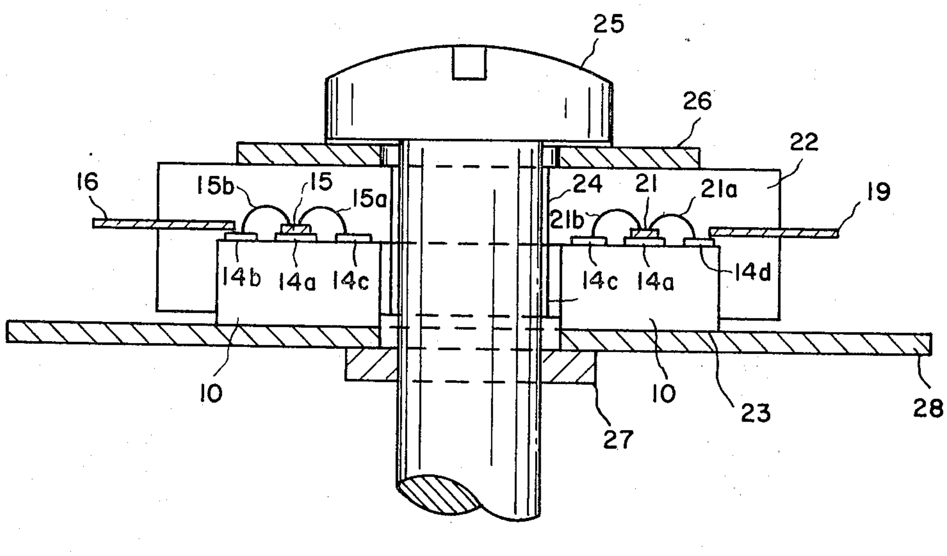
FIG. 2 is a cross-sectional view taken along section 2—2 of FIG. 1.
Figure 3:
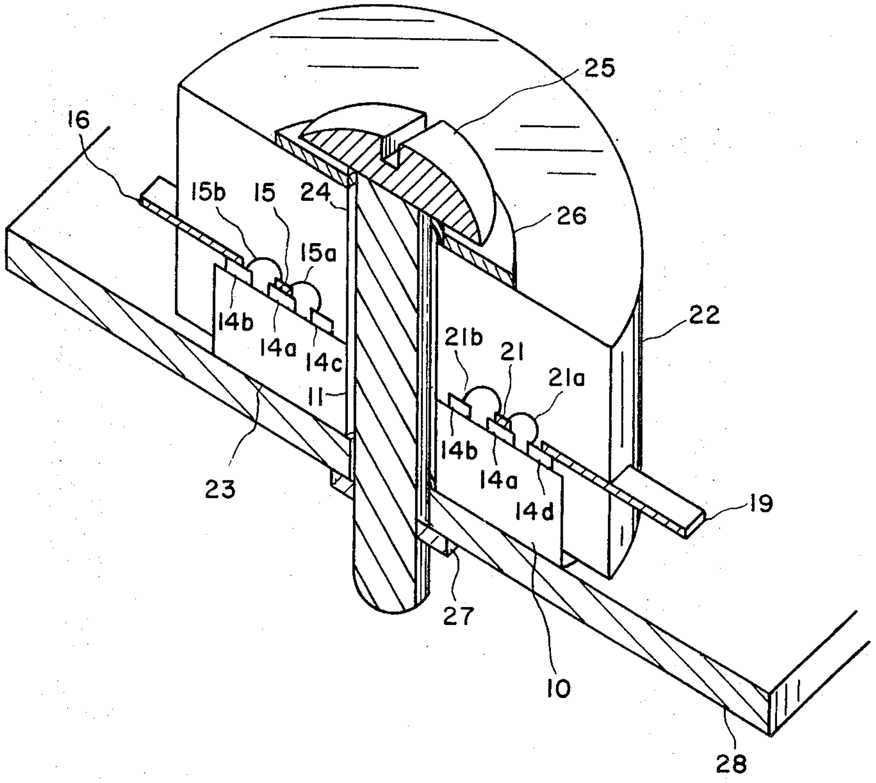
FIG. 3 is a representation of an orthogonal view of a complete assembly housing including encapsulant.

Referring now to FIG. 2, showing a cross-sectional view taken along section lines 2—2 of FIG. 1, and FIG. 3, showing an orthogonal view of the completed housing assembly, the ceramic base member 10, including the metalized areas 14, the semiconductor chip 15, and the additional semiconductor chip 21 which may be provided in an alternative embodiment in the matter as described above, are encapsulated by means of a suitable encapsulant 22 which is formed during application into its desired shape. The actual encapsulation may be provided in any one of many known manners, for example, by placing the ceramic base member 10 into a mold having a shape conforming to the ultimately desired shape of the encapsulant which is then introduced into the mold in a softened state and allowed to solidify, as by cooling. The encapsulant itself may be any suitable form of plastic, e.g., epoxy, or any other known synthetic resin encapsulant having good insulating properties. When the chip is made, or is standard, by the known planar technology, adequate protection against external contaminants is afforded. The encapsulant 22 is placed over the upper surface of the ceramic base member 10 so as to overlay the areas including the metallized portion of the ceramic base member and as shown substantially surrounds the base member, allowing only the lower portion 23 of the ceramic base member to protrude from beneath the encapsulant 22. As shown, the electrodes protrude from the encapsulation or distance sufficient to allow electrical connection to be made thereto. The encapsulant is provided with a central aperture 24, corresponding approximately in size and position and substantially axially aligned with the central aperture 11 formed through the center of the ceramic base member 10.

A suitable detachable element such as a mechanical fastening member in the form of a slotted head screw or bolt 25 having a threaded shaft is inserted down through the aligned apertures so as to pass completely through the encapsulant and ceramic base member and protrude therefrom. A flat metalic washer 26, placed between the screw 25 and the encapsulant 22, may be utilized for distributing the torquing pressure resulting from tightening of the mechanical fastener screw member 25. A nut or locking washer 27 is utilized for securing the housing to a mounting area, such as the support plate 28. The support plate 28 may be any suitable mounting area, such as a chassis or a printed circuit board.

It should be noted that the attachment of the housing to the mounting member 28 provides a secure and direct connection between the ceramic base member 10 and the mounting plate 28. Since the ceramic member is an excellent conductor of heat, heat dissipation is dramatically improved by the direct connection between the ceramic base member and the underlying mounting plate 28.

It is to be understood that the metalizing pattern illustrated in FIG. 1 is purely exemplary, the present invention being in no way limited to the particular pattern shown. The desired pattern of configuration for the metalizing areas may be used as well as any member of externally attached electrodes. Further, the number of semiconductor chips may vary and, as discussed above, may include several chips arranged around the central aperture and connected to cooperate in parallel or independently by the attachment of several external electrodes and by proper metalizing patterns.

The dimensions of the assembly form no part of this invention although it may be generally stated that in connection with the above described embodiment which has been reduced to practice, the assembly housing is substantially circular having a diameter of approximately eleven sixteenths of an inch, and a depth of approximately three sixteenths of an inch, the fore-going measurements being of the plastic encapsulated structure.

Although the invention has disclosed in terms of a particular embodiment, it will be understood that other arrangements may be devised by those skilled in the art which will be within the scope and spirit of the invention.

What is claimed is:

1. A semiconductor encapsulation and mounting assembly for attachment to a mounting area comprising a heat conducting electrically insulating base member having a central aperture and an upper and lower surface, a semiconductor device having a plurality of active areas mounted on said upper surface of said base member, means including a plurality of externally attached electrodes for making contact to various respective active areas of said semiconductive device, encapsulation means covering the upper surface of said base member, said encapsulation means including a central aperture substantially aligned with said central aperture of said base member, and detachable mounting means inserted through said aligned apertures for securing said assembly to said mounting area, said lower surface of said base member forming a secure contact with said mounting area.

2. The combination of claim 1 wherein said base member includes a plurality of semiconductor devices and a plurality of electrodes each individually contacting at least one of the active areas of said semiconductor device.

3. A semiconductor encapsulation and mounting assembly for attachment to a mounting base comprising a ceramic plate member having a central aperture and an upper and lower surface, a plurality of metalized areas arranged about the central aperture on said upper surface of said ceramic base member, a semiconductor device having a plurality of active areas mounted on a first of said metalized areas, the area of said semiconductive device contacting said first metalized area forming a first semiconductor electrode, said first metalized area defining a contact to said first semiconductor electrode, said semiconductor including at least one further electrode, means connecting said further electrode to a second metalized area on said ceramic base member, a first external electrode contacting said first metalized area, a second external electrode contacting said second metalized area, said first and said second external electrodes extending beyond the ceramic base member, encapsulation means substantially covering said upper surface of said common base member, said first and said second external electrodes substantially protruding from said encapsulation means so as to allow electrical connection to said active areas of said semiconductor, said lower surface of said ceramic base member protruding from said encapsulation means, said encapsulation means having a central aperture substantially aligned with said ceramic base member central aperture, and detachable means inserted through said aligned apertures for securing said assembly to said mounting base, said lower surface of said common base member forming a secure contact with said mounting base.

4. The combination of claim 3 wherein said means connecting said further electrode to said second metalized area comprises a lead bonded to said further electrode and to said second metalized area.

5. The combination of claim 3 wherein said semiconductor includes a third active area, and includes means connecting said third active area to a third metalized area, and a third external electrode contacting said third metalized area.

6. The combination of claim 5 wherein a fourth metalized area is provided on said ceramic base member, means connecting said fourth metalized area to said first metalized area, and a fourth external electrode contacting said fourth metalized area.

7. The combination of claim 5 further including a second semiconductor device having three active areas, one of said three active areas secured to said first metalized area, means connecting said second semiconductor device in parallel with said first semiconductor device.

8. A semiconductor mounting assembly comprising a ceramic base member having a central mounting aperture and upper and lower surfaces, a plurality of metalized areas arranged about said central aperture on said upper surface, a semiconductor device having a plurality of active areas said device mounted to one of said metalized area by direct contact with one of said device active areas, means connecting each remaining device active areas to a respective one of said metalized areas, each of said metalized areas including an electrode in electrical contact therewith for providing external electrical access to said device active areas, encapsulation means covering the upper surface of said base member, said encapsulation means including a central aperture substantially aligned with said central aperture of said base member, and means passing through said aligned apertures for mounting said base member directly to a mounting surface.

References Cited

UNITED STATES PATENTS

| | | | |
|---|---|---|---|
| 3,187,240 | 6/1965 | Clark | 317—234 |
| 3,231,797 | 1/1966 | Koch | 317—234 |
| 3,283,224 | 11/1966 | Erkan | 317—234 |
| 3,303,265 | 2/1967 | Noren | 317—234 |
| 3,367,025 | 2/1968 | Doyle | 317—234 |
| 3,419,763 | 12/1968 | Beaudouin | 317—234 |

FOREIGN PATENTS

| | | |
|---|---|---|
| 1,029,322 | 5/1966 | Great Britain. |
| 1,432,457 | 2/1966 | France. |
| 747,578 | 11/1966 | Canada. |

LEWIS H. MYERS, Primary Examiner

G. P. TOLIN, Assistant Exmainer

U.S. Cl. X.R.

317—101, 234

PO-1050
(5/69)

UNITED STATES PATENT OFFICE
CERTIFICATE OF CORRECTION

Patent No. 3,539,875 Dated November 10, 1970

Inventor(s) VICTOR FONG and BRADFORD K. HARRINGTON

It is certified that error appears in the above-identified patent and that said Letters Patent are hereby corrected as shown below:

Claim 3, line 2, cancel "base" and insert --plate--;

line 3, cancel "plate" and insert --base--;

lines 38 and 40, change "base" to --plate--; and lines 29 and 39, change "common" to --ceramic--.

Signed and sealed this 23rd day of January 1973.

(SEAL)
Attest:

EDWARD M.FLETCHER,JR.
Attesting Officer

ROBERT GOTTSCHALK
Commissioner of Patents